(12) United States Patent
Takahashi

(10) Patent No.: US 6,809,366 B2
(45) Date of Patent: Oct. 26, 2004

(54) NON-VOLATILE SEMICONDUCTOR MEMORY DEVICE

(75) Inventor: Keita Takahashi, Nara (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 113 days.

(21) Appl. No.: 10/271,796

(22) Filed: Oct. 17, 2002

(65) Prior Publication Data
US 2003/0071298 A1 Apr. 17, 2003

(30) Foreign Application Priority Data
Oct. 17, 2001 (JP) ........................................ 2001-318866

(51) Int. Cl.[7] .............................................. H01L 27/108
(52) U.S. Cl. ........................ 257/298; 257/210; 257/211; 365/51; 365/63; 365/171; 365/173
(58) Field of Search ................................ 257/210, 211; 365/51, 63, 171, 173

(56) References Cited

U.S. PATENT DOCUMENTS 5,671,177 A 9/1997 Ueki
5,760,437 A 6/1998 Shimoji
6,608,776 B2 * 8/2003 Hidaka ...................... 365/171

FOREIGN PATENT DOCUMENTS

JP 06-077437 A 3/1994
WO WO 01/47019 6/2001

* cited by examiner

Primary Examiner—David Nelms
Assistant Examiner—Mai-Huong Tran
(74) Attorney, Agent, or Firm—McDermott Will & Emery LLP

(57) ABSTRACT

A memory cell array of the non-volatile semiconductor memory device includes a plurality of gate electrodes provided in the row direction, bit lines D1, D2, D3, D4 and source lines S1, S2, S3, S4 provided in the column direction, and memory cells each having a floating gate. The source lines are separately provided in at least two wiring layers. The source line S2 provided in the first layer overlaps the source line S1 provided in the second layer when viewed two-dimensionally. This array structure reduces the dimension of the memory cell array in the row direction, thereby enabling significant reduction in area.

9 Claims, 9 Drawing Sheets

NON-VOLATILE SEMICONDUCTOR MEMORY DEVICE

BACKGROUND OF THE INVENTION

The present invention relates to a non-volatile semiconductor memory device. More particularly, the present invention relates to a non-volatile semiconductor memory device suitable for increased capacity and increased read and write operation speeds.

Recent progress in miniaturization technology raises a demand for a non-volatile semiconductor memory device having an increased capacity and increased read and write operation speeds.

An example of such a non-volatile semiconductor memory device is disclosed in Japanese Laid-Open Publication No. 6-77437. This non-volatile semiconductor memory device will now be described.

FIG. 7 is a circuit diagram showing a memory cell array of a conventional non-volatile semiconductor memory device.

As shown in FIG. 7, the memory cell array of the conventional non-volatile semiconductor memory device includes a plurality of word lines 102, a plurality of bit lines 103, source lines 104, and a plurality of memory cells 101. The plurality of word lines 102 are provided in the row direction. The plurality of bit lines 103 are provided in the column direction so as to cross the word lines 102 in a grade separation manner. Each of the source lines 104 is provided between corresponding two bit lines 103 so as to cross the word lines 102 in a grade separation manner. Each of the plurality of memory cells 101 is a transistor having a gate electrode 107, a source region 106, a drain region 105 and a floating gate 117. Each gate electrode 107 is connected to a corresponding word line 102, each drain region 105 is connected to a corresponding bit line 103, and each source region 106 is connected to a corresponding source line 104. In other words, the memory cell array of the conventional non-volatile semiconductor memory device is formed from a multiplicity of memory cells 101 arranged in a two-dimensional matrix. Note that the memory cells 101 herein refer to a plurality of memory cells arranged in a two-dimensional matrix.

FIG. 8 is a plan view showing the structure of the memory cell array of the conventional non-volatile semiconductor memory device.

As shown in FIG. 8, the drain region 105 of each memory cell 101 is connected to a corresponding bit line wiring 110 (corresponding to the bit line 103 of FIG. 7) via a corresponding drain contact 108, and the source region 106 of each memory cell 101 is connected to a corresponding source line wiring 111 (corresponding to the source line 104 of FIG. 7) via a corresponding source contact 109.

Hereinafter, the positional relation between wirings will be described.

FIGS. 9 to 11 are cross-sectional views of the memory cell array of the conventional non-volatile semiconductor memory device in FIG. 8. More specifically, FIG. 9 is a cross-sectional view taken along line IX—IX in FIG. 8. FIG. 10 is a cross-sectional view taken along line X—X in FIG. S. FIG. 11 is a cross-sectional view taken along line XI—XI in FIG. 8. Note that, for clarity, an interlayer insulating film which fills the gap between the bit line wiring 110 and the source line wiring is not shown in the figures.

As shown in FIGS. 9, 10, 11, each memory cell 1 has a substrate, a p-type well 112 provided on the substrate, an element isolation insulating film 113 provided on the p-type well 112 so as to surround a multiplicity of active regions, a tunnel insulating film 116 provided on the active regions of the substrate, a floating gate 117 provided on the tunnel insulating film 116, an inter-gate-electrode insulating film 118 which covers the top and side surfaces of the floating gate for insulation, and a gate electrode 107 provided on the inter-gate-electrode insulating film 118. Of the active regions, a highly-doped source region 106 and a highly-doped drain region 105 are provided in the p-type well 112 on both sides of the gate electrode 107.

The memory cell array of the conventional non-volatile semiconductor memory device has at least one wiring layer on the interlayer insulating film (not shown in FIGS. 9 to 11) provided on the memory cells 101. The bit line wirings 110 and the source line wirings 111 are provided in the same wiring layer at prescribed intervals. The bit line wiring 110 and the source line wirings 111 are arranged alternately. For illustration, individual bit line wirings 110 are herein referred to as bit line wirings D1, D2, D3, D4, individual source line wirings 111 are herein referred to as source line wirings S1, S2, S3, S4, and the memory cells having a common gate electrode G1 are herein referred to as memory cells 101a, 101b, 101c, 101d from the left side of FIG. 8. The bit line wiring D1 is connected to the drain region of the memory cell 110a via a drain contact 108a which extends through the interlayer insulating film. Similarly, the bit line wirings D2, D3, D4 are respectively connected to the drain regions of the memory cells 101b, 101c, 110d via drain contacts 108b, 108c, 108d. As shown in FIG. 11, the source line wirings S1, S2, S3, S4 are respectively connected to the source regions of the memory cells 101a, 101b, 101c, 101d via source contacts 109a, 109b, 109c, 109d.

This non-volatile semiconductor memory device is capable of writing and erasing information with relatively low power consumption by using a tunneling phenomenon.

Although further miniaturization is demanded for the non-volatile semiconductor memory devices in order to improve an integration degree, the conventional cell array structure as described above hinders such further miniaturization. In other words, in the memory cell array of the conventional non-volatile semiconductor memory device, two wirings formed in the same wiring layer are provided in a single memory cell width of the word line direction (row direction). This limits the memory cell width of the word line direction to the width that allows two wirings to be provided. Moreover, in the case where a plurality of wirings are formed in the same wiring layer, the wirings must be provided at prescribed intervals in view of the miniaturization limits. Therefore, the gap between the wirings cannot be reduced.

SUMMARY OF THE INVENTION

It is an object of the present invention to provide a non-volatile semiconductor memory device having a reduced area of the memory cell array as compared to the conventional examples while maintaining the same functions as those of the conventional examples.

A non-volatile semiconductor memory device of the present invention includes a plurality of non-volatile memory cells, a plurality of wiring layers, and a plurality of first wirings. Each of the plurality of non-volatile memory cells has a semiconductor substrate, a gate electrode, first and second impurity diffusion layers provided in the semiconductor substrate on both sides of the gate electrode, and an information storage section capable of holding information. The plurality of wiring layers are provided above the non-volatile memory cells at different levels. The plurality of first wirings are respectively connected to the first impurity diffusion layers and provided in a column direction so as to be electrically independent of each other. The first wirings have a plurality of partial wirings separately provided in the plurality of wiring layers. When viewed two-dimensionally, the partial wirings are separated from each other at a separation width smaller than a minimum separation width that is obtained when the partial wirings are provided in the same wiring layer.

The above structure enables reduction in density of the first wirings per wiring layer while maintaining the same functions as those of the conventional array structure. Accordingly, the area required for the wirings can be reduced as compared to the case where the first wirings are provided in the same wiring layer. As a result, the memory cell area can be reduced as compared to the conventional non-volatile semiconductor memory device.

Preferably, the partial wirings overlap each other when viewed two-dimensionally, and the partial wirings overlapping each other are respectively connected to the first impurity diffusion layers of adjacent non-volatile memory cells having a common gate electrode. This facilitates formation of the partial wirings which overlap each other when viewed two-dimensionally.

Preferably, the non-volatile semiconductor memory device further includes second wirings respectively connected to the second impurity diffusion layers of the non-volatile memory cells. The total number of the first wirings and the second wirings provided in the same wiring layer is preferably less than two per dimension of a single memory cell in a gate width direction on average. This enables the dimension of a memory cell in the gate width direction to be reduced as compared to the case where the first and second wirings are provided in a single wiring layer. For example, in the case where the first wirings are separately provided in two wiring layers, the dimension of a single memory cell in the gate width direction can be reduced to the width that allows one and a half wirings to be provided, that is, ¾ of the conventional example.

Preferably, the information storage section is an electrically insulated floating gate provided between the gate electrode and the semiconductor substrate. This enables information to be written to, erased from and read from the memory cell by applying an appropriate voltage to the gate electrode and each wiring.

Preferably, the floating gate is formed from a silicon nitride film.

Preferably, the non-volatile semiconductor memory device further includes an insulating film provided on the semiconductor substrate. The information storage section is preferably a ferroelectric film provided between the gate electrode and the insulating film. In this case as well, the memory cell area can be similarly reduced.

DESCRIPTION OF THE PREFERRED EMBODIMENTS

Hereinafter, embodiments of the present invention will be described with reference to the accompanying drawings.

Figure 1:
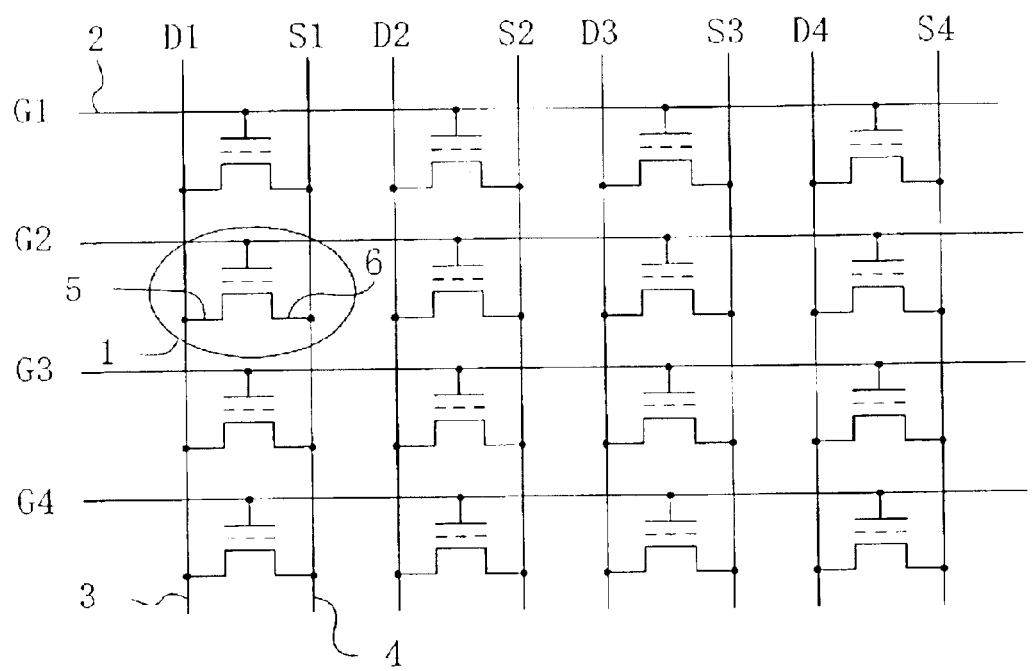
FIG. 1 is a circuit diagram showing a memory cell array of a non-volatile semiconductor memory device according to an embodiment of the present invention.

FIG. 1 is a circuit diagram showing a memory cell array of a non-volatile semiconductor memory device according to an embodiment of the present invention.

As shown in FIG. 1, the memory cell array of the non-volatile semiconductor memory device of the present embodiment includes a plurality of word lines 2, bit lines 3, source lines 4, and a plurality of memory cells. The plurality of word lines 2 are provided in the row direction. The bit lines 3 and the source lines 4 are provided in the column direction so as to cross the word lines 2 in a grade separation manner. The plurality of memory cells 1 are arranged in a two-dimensional matrix, and each memory cell 1 has a floating gate. Each memory cell 1 has its source region 6 (impurity diffusion region) connected to a corresponding source line 4, and its drain region 5 (impurity diffusion region) connected to a corresponding bit line 3. Note that, in the non-volatile semiconductor memory device of the present embodiment, a gate electrode 7 itself functions as a word line 2.

The array structure of the non-volatile semiconductor memory device of the present embodiment is thus represented by the same electric circuit diagram as that of the conventional non-volatile semiconductor memory device.

Hereinafter, the non-volatile semiconductor memory device of the present embodiment will be described mainly in terms of its characteristic wiring structure.

Figure 2:
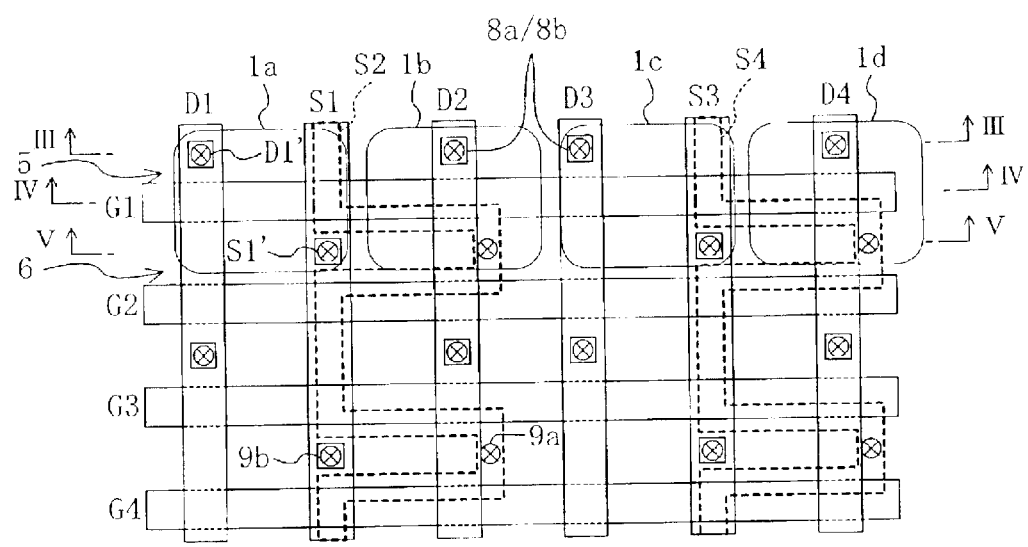
FIG. 2 is a plan view showing the wiring structure of the memory cell array of the non-volatile semiconductor memory device according to the embodiment of the present invention.

FIG. 2 is a plan view showing the wiring structure of the memory cell array of the non-volatile semiconductor memory device of the present embodiment.

As shown in FIG. 2, the memory cell array of the non-volatile semiconductor memory device of the present embodiment includes gate electrodes 7, bit lines 3, source lines 4, and memory cells 1. The gate electrodes 7 include gate electrodes G1, G2, G3, G4 provided in the row direction (horizontal direction in FIG. 2) at regular intervals. The bit lines 3 include bit lines D1, D2, D3, D4 provided in the column direction (vertical direction in FIG. 2) so as to cross the gate electrodes 7 in a grade separation manner with an interlayer insulating film interposed therebetween. The source lines 4 include source lines S1, S2, S3, S4. At least a part of the source lines S1, S2, S3, S4 is provided in parallel with the bit lines 3 with an interlayer insulating film interposed therebetween, and the source lines S1, S2, S3, S4 cross the gate electrodes 7 in a grade separation manner. The memory cells 1 are arranged in a two-dimensional matrix, and each memory cell 1 has a floating gate 17. The gate electrodes 7 herein collectively refer to the individual gate electrodes G1, G2, G3, G4, and the memory cells 1 collectively refer to the individual memory cells.

The memory cells 1 having a common gate electrode G1 are herein referred to as memory cells 1a, 1b, 1c, 1d from the left side of FIG. 2. The bit lines D1, D2, D3, D4 are respectively connected to the drain regions 5 of the memory cells 1a, 1b, 1c, 1d via contacts, and the source lines S1, S2, S3, S4 are respectively connected to the source regions 6 of the memory cells 1a, 1b, 1c, 1d via contacts. Note that the drain regions 5 herein collectively refer to the drain regions of the individual memory cells, and the source regions 6 collectively refer to the source regions of the individual memory cells.

For clarity, the source lines S2, S4 shown by thick dashed line in FIG. 2 are shown to be thinner than the other source lines. In the actual structure, however, the source lines S2, S4 have the same width as that of the other source lines.

Figure 3:
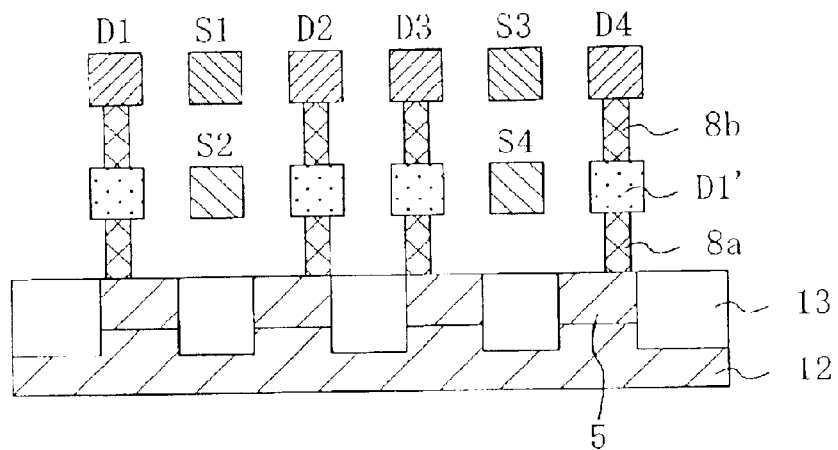
FIG. 3 is a cross-sectional view taken along line III—III in FIG. 2.
Figure 4:
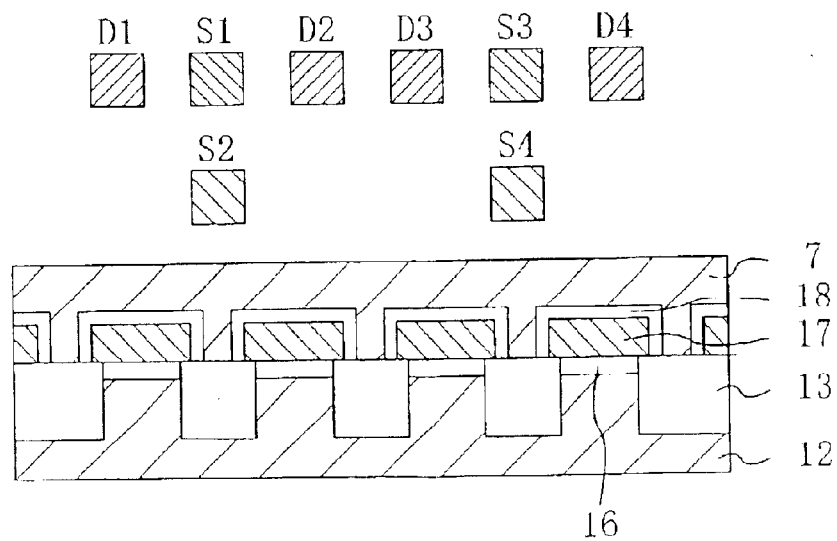
FIG. 4 is a cross-sectional view taken along line IV—IV in FIG. 2.
Figure 5:
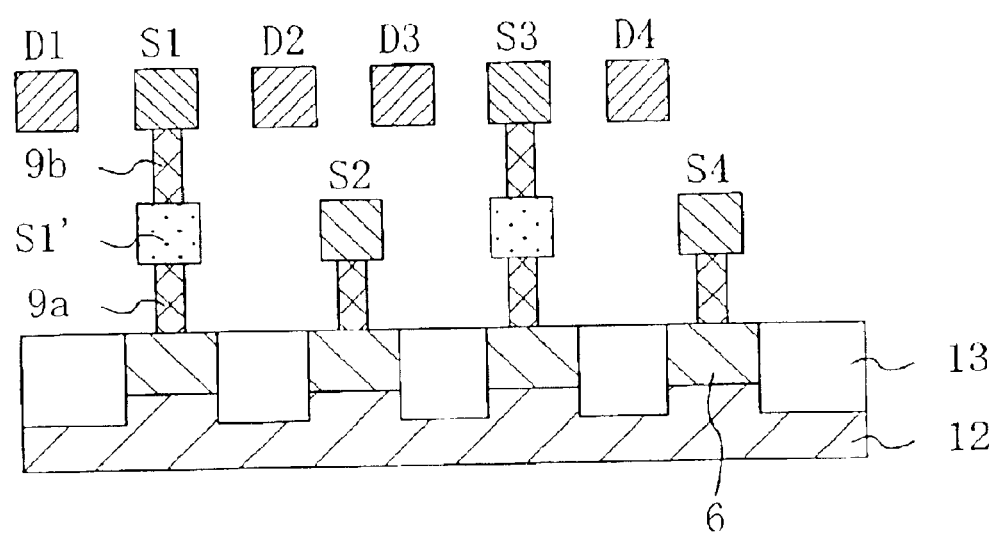
FIG. 5 is a cross-sectional view taken along line V—V in FIG. 2.

FIG. 3 is a cross-sectional view of a drain contact portion of the memory cell array in the non-volatile semiconductor memory device of the present embodiment in FIG. 2. FIG. 4 is a cross-sectional view of a gate electrode portion of the memory cell array in the non-volatile semiconductor memory device of the present embodiment in FIG. 2. FIG. 5 is a cross-sectional view of a source contact portion of the memory cell array in the non-volatile semiconductor memory device of the present embodiment in FIG. 2. More specifically, FIG. 3 is a cross-sectional view taken along line III—III in FIG. 2, FIG. 4 is a cross-sectional view taken along line IV—IV in FIG. 2, and FIG. 5 is a cross-sectional view taken along line V—V in FIG. 2. Although an interlayer insulating film is actually present between each wiring and each contact, the interlayer insulating film is not shown in the figures for clarity.

In the conventional non-volatile semiconductor memory device, the source lines and the bit lines are provided in a single wiring layer. As can be seen from FIGS. 3, 4, 5, however, in the memory cells of the non-volatile semiconductor memory device of the present embodiment, the source lines which are electrically independent of each other are separately provided in at least two wiring layers.

It is now assumed that the source lines are separately provided in first and second wiring layers. For example, if the source line S1 is provided in the second wiring layer, the source line S2 is provided in the first wiring layer. Similarly, the source line S3 is provided in the second wiring layer, and the source line S4 is provided in the first wiring layer. In this way, the source lines connected to adjacent source regions 6 are separately provided in the first and second wiring layers. In this case, the wirings in the second wiring layer are arranged at intervals large enough to insulate the wirings from each other, and the wirings of "a bit line, a source line and a bit line" are provided repeatedly.

As shown in FIG. 3, the bit line D1 is connected to the drain region 5 of the memory cell 1a via a first-layer drain contact 8a, an isolated wiring D1', and a second-layer drain contact 8b. In this way, each of the bit lines D2, D3, D4 is similarly connected to a corresponding one of the memory cells 1b, 1c, 1d via a first-layer drain contact, an isolated wiring and a second-layer drain contact.

As shown in FIG. 5, the source line S1 is connected to the source region 6 of the memory cell 1a via a first-layer source contact 9a, an isolated wiring S1', and a second-layer source contact 9b. The source line S2 is connected to the source region 6 of the memory cell 1b via a first-layer source contact 9a alone. Note that the first-layer drain contacts 8a, the second-layer drain contacts 8b, the first-layer source contacts 9a and the second-layer source contacts 9b each collectively refer to a plurality of contacts. Individual contacts are insulated from each other with an interlayer insulating film interposed therebetween. Note that the wirings in the first and second wring layers are formed from a metal such as aluminum (Al), a metal alloy, or the like.

As can be seen from FIG. 3, in the memory cells of the present embodiment, the source lines are provided in two wiring layers formed at different levels. This enables the dimension of two memory cells in the row direction to be reduced to the width that allows three wirings to be provided. In the conventional memory cells, the dimension of two memory cells in the row direction corresponds to the width that allows four wirings to be provided. Therefore, in the non-volatile semiconductor memory device of the present embodiment, the area of the memory cell array can be reduced to about ¾ of the conventional example according to simple calculation. This enables implementation of a non-volatile semiconductor memory device having improved integration over the conventional example.

Note that, in the non-volatile semiconductor memory device of the present embodiment, the source lines S1, S2 provided in two wiring layers formed at different levels at least partially overlap each other when viewed two-dimensionally. With this structure, the bit lines 3 and the source lines 4 are efficiently provided within each wiring layer, enabling effective reduction in cell array area. However, the two source lines may not overlap each other. In this case, the cell array area can be reduced as long as the gap between the source lines is smaller than the minimum separation width of the source lines which is obtained in the case where the source lines are provided in the same wiring layer, when viewed two-dimensionally.

As shown in FIG. 2, in the cross sections taken along lines III—III and IV—IV, the source line S2 provided in the first wiring layer is located right below the source line S1 provided in the second wiring layer. In the cross section taken along line V—V, however, the source line S1 is located between the bit lines D2, D3 when viewed two-dimensionally. In other words, the source line S2 is folded into a U-shape at a position between the gate electrodes G1, G2 and extends to a position above the source region 6 of the memory cell 1b. The other source lines 4 which overlap each other when viewed two-dimensionally have the same structure as that of the source lines S1, S2.

This structure enables the overlapping two source lines 4 to be respectively connected to the source regions of adjacent memory cells, and enables significant reduction in area of the memory cell array.

As shown in FIG. 4, each memory cell used in the non-volatile semiconductor memory device of the present embodiment has a substrate, an element isolation insulating film 13, a tunnel insulating film 16, an electrically isolated floating gate 17, an inter-gate-electrode insulating film 18, a gate electrode 7, a drain region 5, and a source region 6. The substrate has a p-type well 12. The element isolation insulating film 13 is provided in the p-type well 12 of the substrate. The tunnel insulating film 16 is formed from $SiO_2$. The floating gate 17 is provided on the tunneling insulating film 16. The inter-gate-electrode insulating film 18 surrounds the side and top surfaces of the floating gate 17. The gate electrode 7 is provided on the substrate. The drain region 5 and the source region 6 are provided in the p-type well 12 on both sides of the gate electrode, and contain n-type impurities at a high concentration. This memory cell structure is the same as that of the conventional example. Charges are discharged from and introduced into the floating gate 17 by using an FN (Fowler-Nordheim) tunneling phenomenon (a phenomenon that electrons pass through the whole tunnel insulating film 16), thereby enabling each memory cell to function as a non-volatile memory cell capable of writing and erasing information.

Hereinafter, a method for forming the wirings will be described briefly.

Figure 6A:
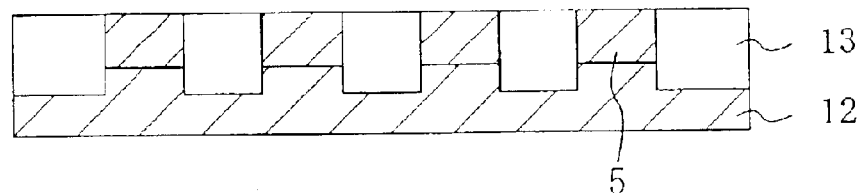
FIGS. 6A, 6B and 6C are cross-sectional views illustrating steps of forming wirings in the non-volatile semiconductor memory device according to the embodiment of the present invention.
Figure 6B:
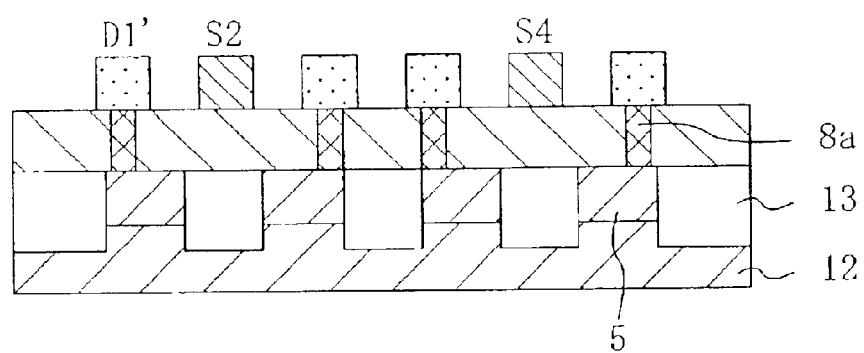
Figure 6C:
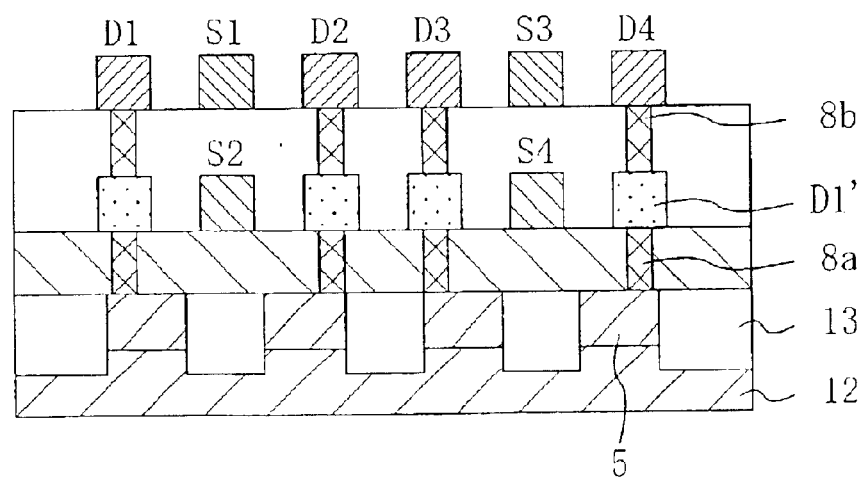
Figure 7:
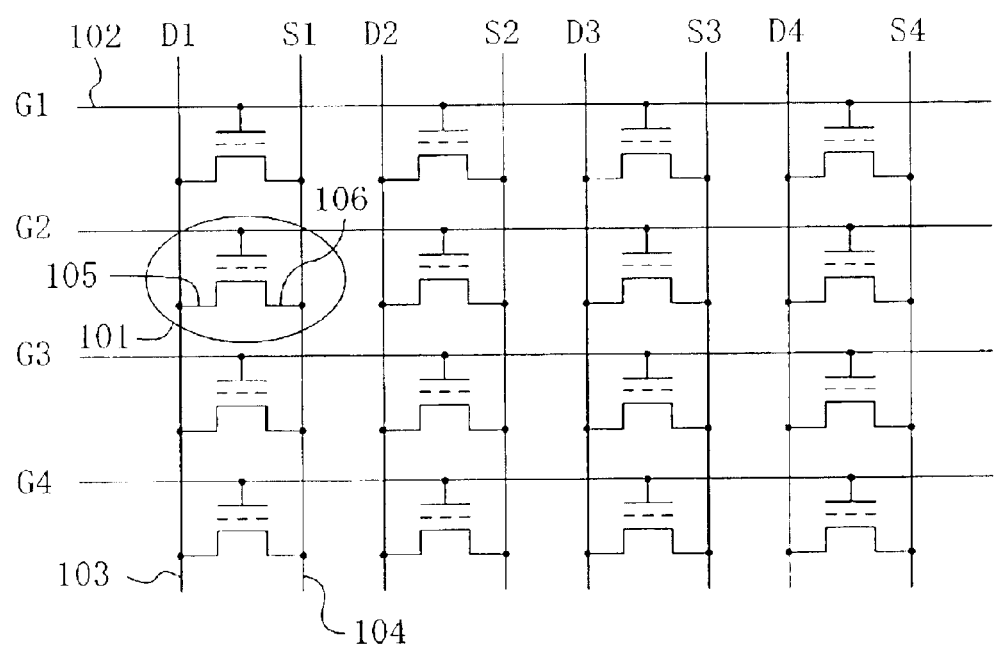
FIG. 7 is a circuit diagram showing a memory cell array of a conventional non-volatile semiconductor memory device.
Figure 8:
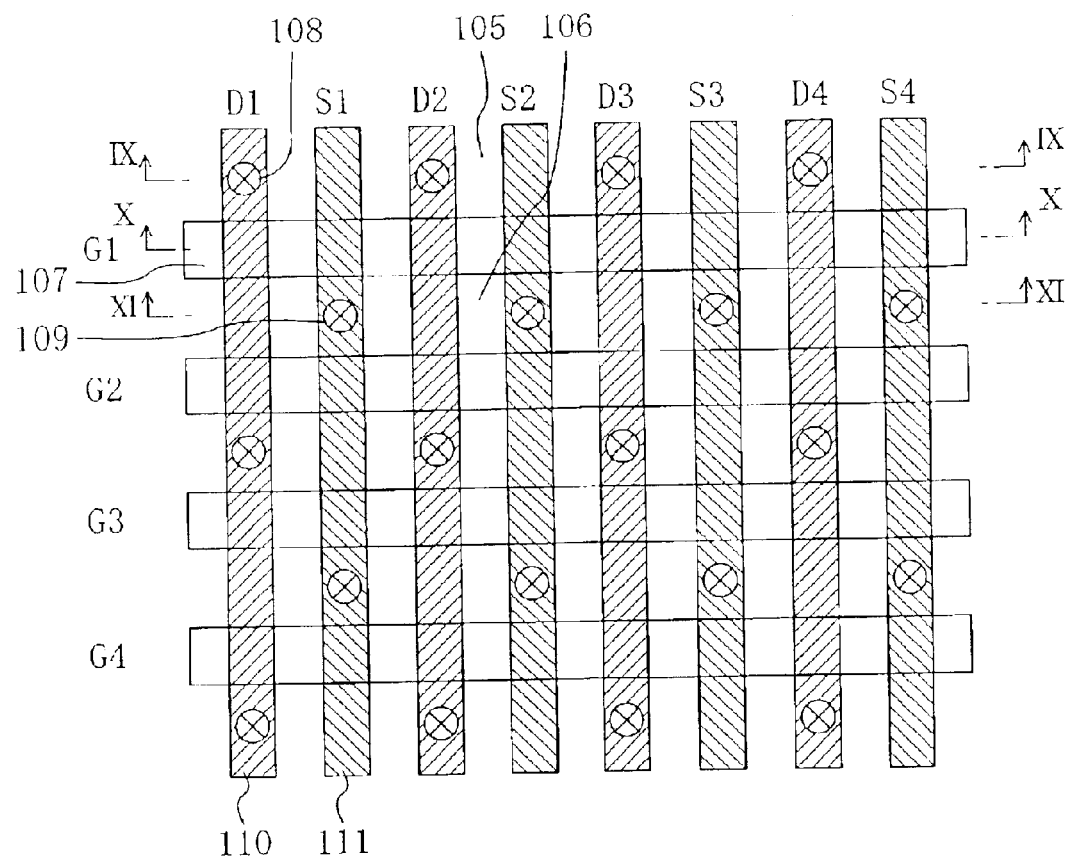
FIG. 8 is a plan view showing the structure of the memory cell array of the conventional non-volatile semiconductor memory device.
Figure 9:
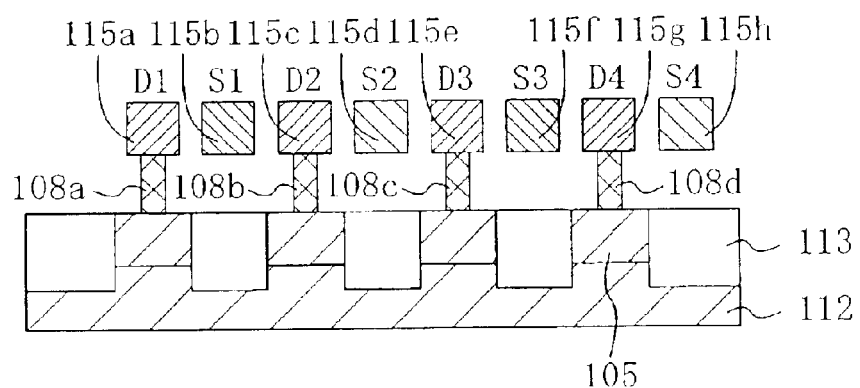
FIG. 9 is a cross-sectional view taken along line IX—IX in FIG. 8.
Figure 10:
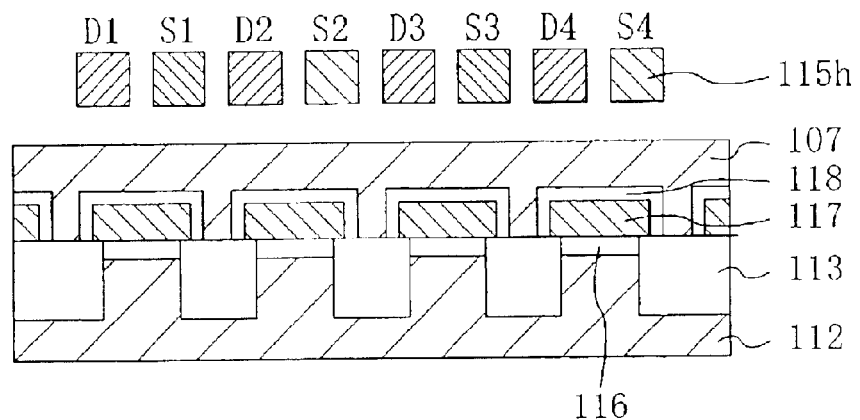
FIG. 10 is a cross-sectional view taken along line X—X in FIG. 8.
Figure 11:
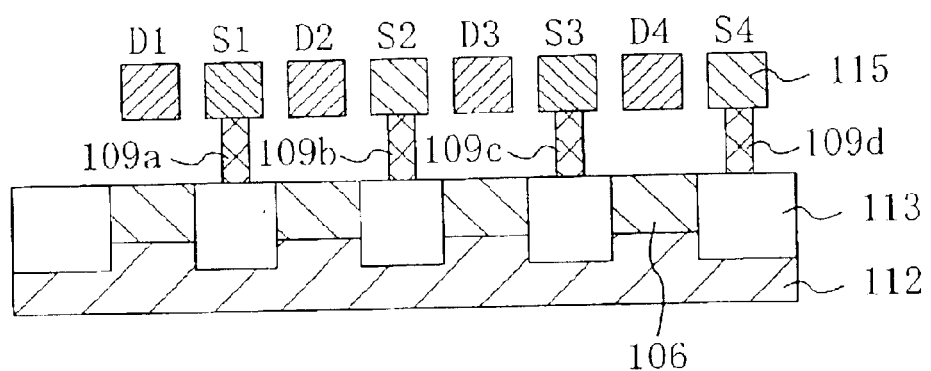
FIG. 11 is a cross-sectional view taken along line XI—XI in FIG. 8.

FIGS. 6A to 6C are cross-sectional views illustrating the steps of forming wirings in the non-volatile semiconductor memory device of the present embodiment. Note that FIGS. 6A to 6C correspond to the cross section taken along line III—III in FIG. 2.

In the steps up to FIG. 6A, EEPROM (electrically erasable programmable read only memory)-type memory cells 1 each having a floating gate on the p-type well 12 formed in the semiconductor substrate are formed by a known method (only the drain regions of the memory cells 1 are shown in the figure).

In the step of FIG. 6B, an interlayer insulating film formed from $SiO_2$ or the like is deposited on the substrate. The interlayer insulating film is then etched by a known method to form contact holes extending to the source regions 6 and the drain regions 5 of the memory cells 1. Thereafter, a material such as polysilicon is deposited so as to fill the contact holes, and first-layer drain contacts 8a and first-layer source contacts 9a are formed by a CMP (chemical mechanical polishing) method (only the first-layer drain contacts 8a are shown in the figure).

Thereafter, a metal such as Al is deposited on the substrate, and the wirings in the first wiring layer, that is, source lines S2, S4 connected to the source regions 6 (not shown) of the memory cells 1 and isolated wirings, are formed on the substrate by a known lithography technology and a known etching technology.

Note that forming the isolated wirings in this step enables source lines and bit lines which will be later formed in the second wiring layer to be connected to the source regions 6 and the drain regions 5 of the memory cells 1, respectively.

In the step of FIG. 6C, an interlayer insulating film is deposited on the substrate, and via holes are formed by a known method so as to extend to the isolated wirings of the first wiring layer through the interlayer insulating film. Thereafter, second-layer drain contacts 8b and second-layer source contacts 9b are formed from polysilicon or the like by a known method (only the second-layer drain contacts 8b are shown in the figure). A metal such as Al is then deposited on the substrate. The metal layer thus formed is patterned to form bit lines and source lines in the second wiring layer.

In this way, the non-volatile semiconductor memory device of the present embodiment can be easily manufactured with the existing facilities. Moreover, since the number of steps is not increased as compared to the conventional device, the area of the memory cell array can be reduced without increasing the manufacturing costs.

Note that, in the non-volatile semiconductor memory device of the present embodiment, the source line S2 is folded into a U-shape at a position between the gate electrodes G1, G2. However, the source line S2 may be folded at any position as long as there is a margin enough to insulate the isolated wiring S1' and the source line S2 from each other.

In the non-volatile semiconductor memory device of the present embodiment, the bit lines extend straight. However, arrangement of the bit lines and the source lines may be varied appropriately so as to allow the memory cell array to have the smallest area. For example, the bit line may be folded in the opposite direction to the source line at a position above the source region 6.

In the non-volatile semiconductor memory device of the present embodiment, the wirings are separately provided in two wiring layers. However, the wirings may be separately provided in three wiring layers. This enables further reduction in cell area in the word line direction and thus enables further reduction in area of the memory cell array.

In the present embodiment, some source lines are provided in the first layer. However, the area can be similarly reduced even if the bit lines are provided in the first layer. Alternatively, the source lines in the second layer may overlap the bit lines in the first layer in a grade separation manner. Alternatively, the source lines in the first layer may be provided under the bit lines in the second layer. Since the bit lines and the source lines have a symmetrical structure, the bit lines and the sources line can be arranged in an arbitrary manner.

In the memory cells of the non-volatile semiconductor memory device of the present embodiment, the gate electrodes extend straight in the row direction. However, the gate electrodes may be folded. Alternatively, the non-volatile semiconductor memory device may further include word lines each connected to a corresponding gate electrode.

In the non-volatile semiconductor memory device of the present embodiment, the memory cell may have an MNOS (metal nitride oxide semiconductor) structure. More specifically, the memory cell may have a silicon oxide film ($SiO_2$), a silicon nitride film ($Si_3N_4$) and a silicon oxide film between the gate electrode formed from polysilicon and the p-type semiconductor substrate sequentially from the substrate. Alternatively, the memory cell may have an MFIS (metal ferroelectric insulator semiconductor) structure. More specifically, the memory cell may have a gate insulating film and a ferroelectric film between the semiconductor substrate and the gate electrode sequentially from the substrate. In other words, any transistor having source and drain regions, a gate electrode, and a layer capable of holding information between the gate electrode and the substrate in a non-volatile manner can be used as a memory cell of the semiconductor memory device of the present embodiment.

The memory cell used in the semiconductor memory device of the present invention is not necessarily formed from a single transistor. For example, the present invention is applicable to the memory cell formed from a single memory transistor and a single selection transistor as disclosed in Japanese Laid-Open Publication No. 11-177068. In this case as well, the area of the memory cell array can be reduced.

In the present embodiment, information is written to and erased from the memory cell by a FN tunnel current. However, information may be written to and erased from the memory cell by another method. For example, information may be written to the memory cell by injecting electrons into the floating gate by CHE (Channel Hot Electron).

The non-volatile semiconductor memory device of the present invention has a significantly reduced area while retaining the same functions as those of the conventional examples. Therefore, the non-volatile semiconductor memory device of the present invention can be used in various equipments such as memories of mobile phones and memory cards.

What is claimed is:

1. A non-volatile semiconductor memory device, comprising:

a plurality of non-volatile memory cells each having a semiconductor substrate, a gate electrode, first and second impurity diffusion layers provided in the semiconductor substrate on both sides of the gate electrode, and an information storage section capable of holding information; and a plurality of first wirings formed by using a plurality of wiring layers provided above the non-volatile memory cells at different levels, the plurality of first wirings are respectively connected to the first impurity diffusion layers and arranged such that the plurality of first wirings extend in a column direction so as to be electrically independent of each other, wherein the first wirings in a row direction are respectively provided in the plurality of wiring layers, which are being provided at different levels, and are separated from each other.

2. The non-volatile semiconductor memory device according to claim 1, wherein when viewed two-dimensionally, the first wirings in the row direction are separated from each other at a separation width smaller than a minimum separation width that is obtained when the first wirings are provided in the same wiring layer.

3. The non-volatile semiconductor memory device according to claim 2, wherein the fiat wirings overlap each other when viewed two-dimensionally.

4. The non-volatile semiconductor memory device according to claim 2, further comprising:

second wirings respectively connected to the second impurity diffusion layers of the non-volatile memory cells, wherein the total number of the first wirings and the second wirings provided in the same wiring layer is less man two per dimension of a single memory cell in a gate width direction on average.

5. The non-volatile semiconductor memory device according to claim 4, wherein either the first wirings or the second wirings are source lines and the other are bit lines.

6. The non-volatile semiconductor memory device according to claim 1, wherein the information storage section is an electrically insulated floating gate provided between the gate electrode and the semiconductor substrate.

7. The non-volatile semiconductor memory device according to claim 6, wherein the floating gate is formed from a silicon nitride film.

8. The non-volatile semiconductor memory device according to claim 1, further comprising:

an insulating film provided on the semiconductor substrate, wherein the information storage section is a ferroelectric film provided between the gate electrode and the insulating film.

9. The non-volatile semiconductor memory device according to claim 1, wherein the first wirings are source lines or bit lines.

* * * * *